United States Patent
Lin et al.

(10) Patent No.: US 7,716,026 B2
(45) Date of Patent: May 11, 2010

(54) NON-DESTRUCTIVE METHOD FOR INVERSE-CALCULATING FIBER PROBE APERTURE SIZE AND PREDICTION METHOD OF FABRICATION PROFILE OF NEAR FIELD PHOTOLITHOGRAPHY

(75) Inventors: Zone-Ching Lin, Taipei (TW); Ching-Been Yang, Taoyuan County (TW)

(73) Assignee: National TAiwan University of Science and Technology, Taipei (TW)

( * ) Notice: Subject to any disclaimer, the term of this patent is extended or adjusted under 35 U.S.C. 154(b) by 460 days.

(21) Appl. No.: 11/749,562

(22) Filed: May 16, 2007

(65) Prior Publication Data
US 2008/0208545 A1 Aug. 28, 2008

(30) Foreign Application Priority Data
Feb. 27, 2007 (TW) .............................. 96106816 A (51) Int. Cl.
G06F 17/50 (2006.01)
G06F 7/60 (2006.01)
G06G 7/48 (2006.01)
G01B 11/00 (2006.01)
G01B 11/14 (2006.01)

(52) U.S. Cl. .............................. 703/6; 703/2; 356/401; 356/625; 716/4; 716/19; 716/21

(58) Field of Classification Search ................... 378/24; 703/2, 6; 356/401, 625; 716/4, 19, 21
See application file for complete search history.

(56) References Cited

U.S. PATENT DOCUMENTS

| | | | | |
|---|---|---|---|---|
| 6,049,660 A * | 4/2000 | Ahn et al. | ...................... | 703/13 |
| 6,453,457 B1 * | 9/2002 | Pierrat et al. | .................. | 716/19 |
| 6,539,521 B1 * | 3/2003 | Pierrat et al. | .................... | 716/4 |
| 6,972,852 B2 * | 12/2005 | Opsal et al. | .................. | 356/625 |
| 6,982,793 B1 * | 1/2006 | Yang et al. | ................... | 356/401 |
| 7,016,017 B2 * | 3/2006 | Hansen | ......................... | 355/67 |
| 7,207,029 B2 * | 4/2007 | Beale et al. | .................... | 716/21 |

(Continued)

OTHER PUBLICATIONS

Crisalle et al. "Adaptive Control of Photolithography", AIChE Journal Jan. 1992 vol. 38, No. 1.*
Lee et al. "An Inverse Problem of Estimating the Heat Source in Tapered Optical Fibers for Scanning Near-Field Optical Microscopy", Jan. 2007.*
Power, J.F. "Inverse Problem Theory in the Optical Depth Profilometry of Thin Films" Review of Scientific Instruments, vol. 73, No. 12, Dec. 2002.*
Crisalle et al. "Adaptive Control of Photolithography", AIChE Journal Jan. 1992 vol. 38, No. 1.*

(Continued)

*Primary Examiner*—Kamini S Shah
*Assistant Examiner*—Shambhavi Patel
(74) *Attorney, Agent, or Firm*—J.C. Patents (57) ABSTRACT

A non-destructive method to inverse-calculate a fiber probe aperture size, and a prediction method of the simulation and fabrication profile of near field photolithography are provided. The error between an experimental result of the photolithography and a simulation result of the theoretical model of near field photolithography is set as an objective function to inverse-calculate a fiber probe aperture size that can match with the photolithography experiment and the theoretical model of near field photolithography. Finally, by comparing the fabrication profile of the photolithography experiment and that of the simulation result of the inverse-calculated fiber probe aperture size, it is verified that the inverse-calculated fiber probe aperture size is reasonable and acceptable. By combining with other parameter control of near field photolithography, the present invention also proposes a prediction method of the fabrication profile of near field photolithography by means of inversely calculating the fiber probe aperture size.

3 Claims, 4 Drawing Sheets

U.S. PATENT DOCUMENTS

| | | | |
|---|---|---|---|
| 7,215,431 B2 * | 5/2007 | Opsal | 356/630 |
| 7,230,705 B1 * | 6/2007 | Yang et al. | 356/401 |
| 7,245,356 B2 * | 7/2007 | Hansen | 355/67 |
| 7,248,375 B2 * | 7/2007 | Opsal et al. | 356/625 |
| 7,266,800 B2 * | 9/2007 | Sezginer | 716/21 |
| 7,443,486 B2 * | 10/2008 | Van Ingen Schenau et al. | 355/69 |
| 7,476,879 B2 * | 1/2009 | Lozes et al. | 250/492.22 |
| 7,523,439 B2 * | 4/2009 | Wen et al. | 716/21 |
| 7,536,670 B2 * | 5/2009 | Percin et al. | 716/19 |
| 2003/0021467 A1 * | 1/2003 | Adel et al. | 382/151 |
| 2005/0240895 A1 * | 10/2005 | Smith et al. | 716/19 |
| 2005/0273753 A1 * | 12/2005 | Sezginer | 716/21 |
| 2006/0012803 A1 * | 1/2006 | Opsal et al. | 356/625 |
| 2007/0011648 A1 * | 1/2007 | Abrams | 716/21 |

OTHER PUBLICATIONS

Lee et al. "An Inverse Problem of Estimating the Heat Source in Tapered Optical Fibers for Scanning Near-Field Optical Microscopy", Jan. 2007.*

Power, J.F. "Inverse Problem Theory in the Optical Depth Profilometry of Thin Films" Review of Scientific Instruments, vol. 73, No. 12, Dec. 2002.*

Rathsack, et al. "Optical Lithography Simulation and Photoresist Optimization for Photomask Fabrication", 1999.*

* cited by examiner

NON-DESTRUCTIVE METHOD FOR INVERSE-CALCULATING FIBER PROBE APERTURE SIZE AND PREDICTION METHOD OF FABRICATION PROFILE OF NEAR FIELD PHOTOLITHOGRAPHY

CROSS-REFERENCE TO RELATED APPLICATION

This application claims the priority benefit of Taiwan application serial no. 96106816, filed Feb. 27, 2007. All disclosure of the Taiwan application is incorporated herein by reference.

BACKGROUND OF THE INVENTION

1. Field of the Invention

The present invention relates to a prediction method of near field photolithography fabrication. More particularly, the present invention relates to a non-destructive method for inverse-calculating a fiber probe aperture size and a prediction method of the fabrication profile of near field photolithography.

2. Description of Related Art

Currently, if it is required to confirm the fiber probe aperture size, an electron microscope is generally used for measurement, which, however, may cause the fiber probe to be damaged and cannot be used again. Therefore, when developing the technique of near field photolithography fabrication, the largest bottleneck lies that, it is impossible to confirm the fiber probe aperture size through a non-destructive method. Meanwhile, no relevant document on the inverse-calculation of the fiber probe aperture size by a non-destructive method has been applied.

SUMMARY OF THE INVENTION

Accordingly, the present invention is directed to a non-destructive method for inverse-calculating a fiber probe aperture size, and a prediction method of a fabrication profile of near field photolithography, so as to solve the bottleneck that the aperture size can be obtained only through the destructive measurement of the fiber probe.

The present invention provides a non-destructive method for inverse-calculating the fiber probe aperture size, which includes first analyzing a fiber probe with an aperture size being inverse-calculated; and then simulating and predicting a fabrication profile of near field photolithography by combining with other parameter control of near field photolithography.

The present invention provides a non-destructive method for inverse-calculating the fiber probe aperture size, which is applicable for analyzing fiber probes, and classifying the fiber probes into different groups and sets according to the aperture size value and marking the probe aperture size during production, so as to achieve category management and sales of the probes, which thus enhancing the industry value of the fiber probe.

The present invention provides a non-destructive method for inverse-calculating the fiber probe aperture size and a prediction method of the fabrication profile of near field photolithography, which includes the following five steps.

The first step is to build a theoretical model of near field photolithography, including a theoretical model of a point fabrication of near field photolithography and a theoretical model of a line fabrication of near field photolithography.

The second step is to set an error between a simulation result of the theoretical model of the line fabrication of near field photolithography and the experimental result of the theoretical model of the line fabrication of photolithography as an objective function.

The third step is to search for a reasonable convergence criteria through Levenberg-Marquardt method and to inverse-calculate a fiber probe aperture size that can match with the line lithography experiment and the theoretical model of the line fabrication of near field photolithography.

The forth step is to compare the fabrication profile of the line lithography experiment with that of the simulation result of the inverse-calculated probe aperture size, so as to verify that the inverse-calculated fiber probe aperture size is reasonable.

The fifth step is to predict the fabrication profile of near field photolithography by combining the parameter control of near field photolithography with the fiber probe aperture size being inverse-calculated.

The present invention adopts a non-destructive method for inverse-calculating the fiber probe aperture size, so as to solve the bottleneck that an aperture size of the fiber probe can only be obtained through a destructive method, which is a breakthrough in the technique for measuring the aperture size of the fiber probe. Meanwhile, by combining other parameter control of near field photolithography with the fiber probe aperture size being inverse-calculated, the fabrication profile of near field photolithography can be simulated and predicted, which has an industrial application value.

In order to make the aforementioned and other objects, features and advantages of the present invention comprehensible, preferred embodiments accompanied with figures are described in detail below.

It is to be understood that both the foregoing general description and the following detailed description are exemplary, and are intended to provide further explanation of the invention as claimed.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF EMBODIMENTS

Figure 1A:
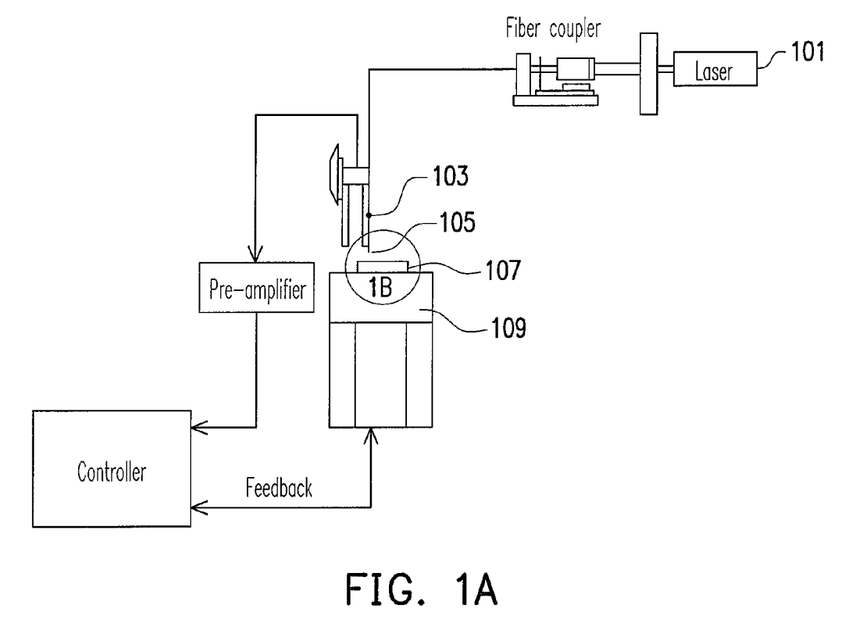
FIG. 1A is a schematic view of a line fabrication experiment of near field photolithography.
Figure 1B:
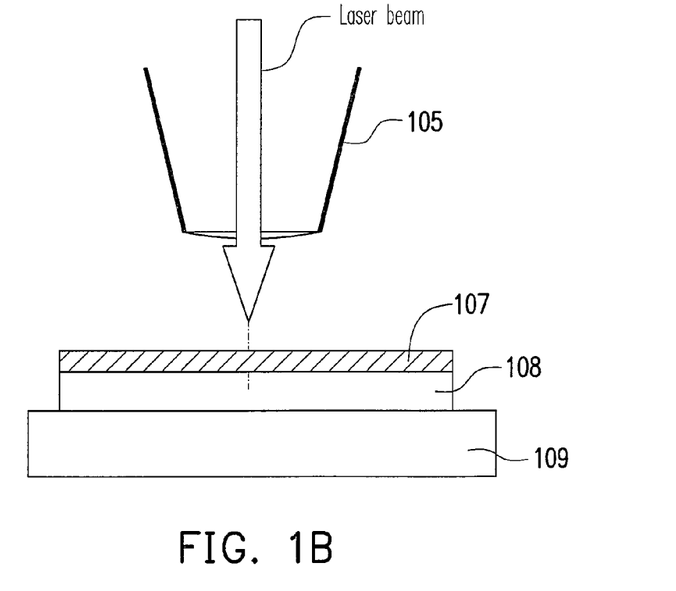
FIG. 1B is a schematic view of a fiber probe and a photoresist.

FIG. 1A is a schematic view of a line fabrication experiment of near field photolithography. A fiber probe 105 is adhered on one side of a tuning fork 103, and the other side of the tuning fork 103 is attached to a Z-shaft machine. The near field distance between the fiber probe 105 and the test piece 107 is controlled by a shear stress tuning fork model. The tuning fork 103 is asymmetric, and if one side of the tuning fork 103 is excited, a difference in voltage between the two electrodes on both sides is produced. When the fiber probe 105 approaches the test piece (for example, a photoresist 107) to a near field distance, the fiber probe 105 will senses the atomic force and change the amplitude, so that the voltage of the tuning fork 103 will be changed. The tuning fork 103 feedbacks an output voltage to control the height of the z-axle. Therefore, a fixed near field distance between the fiber probe 105 and the photoresist can be maintained by controlling the output voltage at a fixed value. In order to make a clearer display of the diagram, the small circle 1B in FIG. 1A is magnified and displayed in FIG. 1B. FIG. 1B is a schematic view of a fiber probe and a photoresist. The photoresist 107 is directly spin-coated on a substrate 108, and then disposed on the platform of a near field optical microscope 109 after being soft backed. An Argon (Ar) ion laser beam 101 passes through a fiber couple and is transmitted to the tip of the fiber probe 105. Next, the photoresist 107 is exposed at a near field distance. After performing the exposure, the photoresist is developed, hard-baked and measured using an atomic force microscope (AFM).

Figure 2:
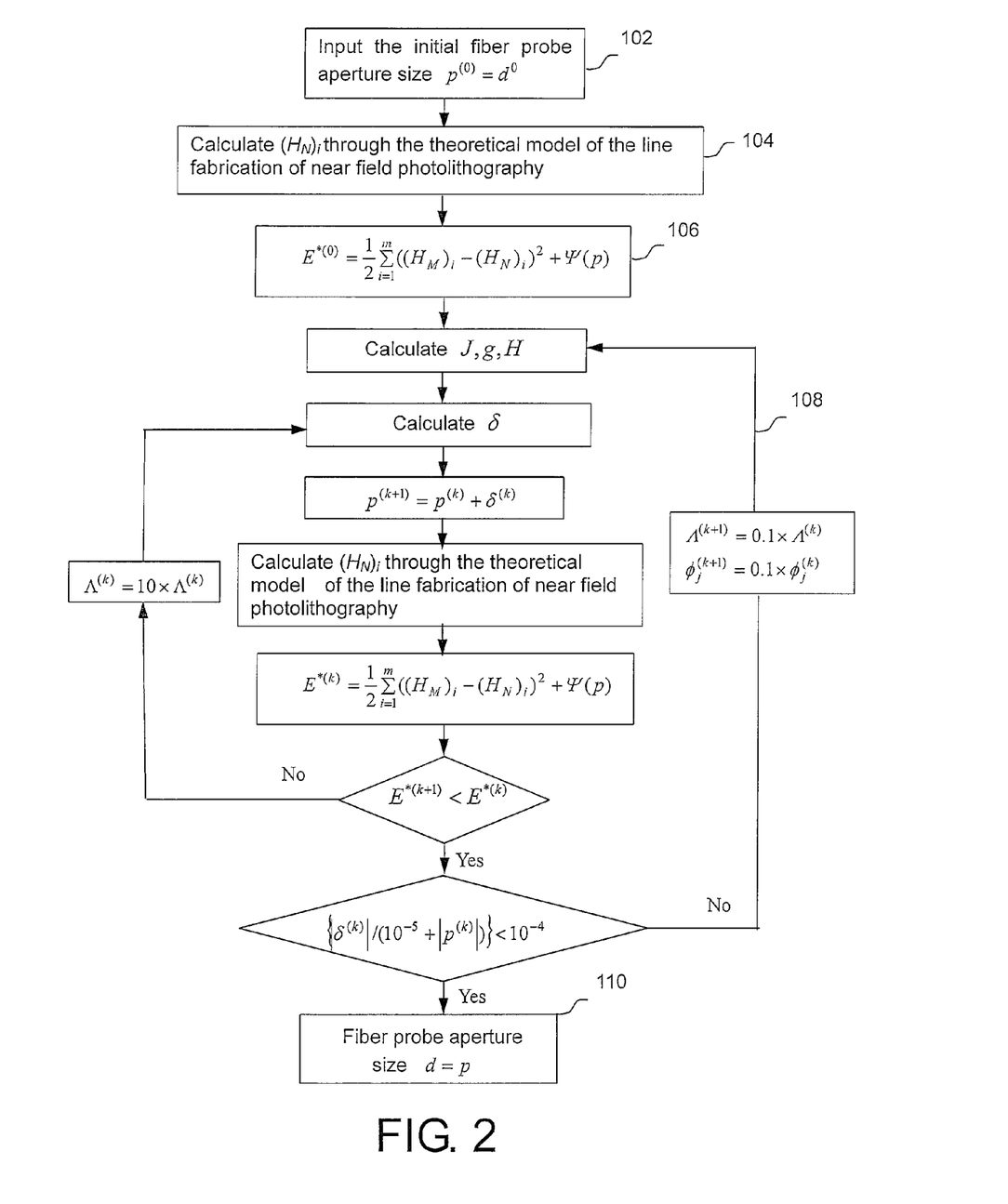
FIG. 2 is a flow chart of an inverse-calculation of a fiber probe aperture size.

In Step 204 of FIG. 2, first, a theoretical model of near field photolithography of the present invention is built, which includes a theoretical model of a point fabrication of near field photolithography and a theoretical model of a line fabrication of near field photolithography. The theoretical model of lithography is combined by the exposure energy density analysis method, radiation field theory, Dill exposure model, and Mack development model. The flow of the theoretical model of the line fabrication of near field photolithography in the present invention is illustrated as follows.

Firstly, the near-field optical power density distribution of an Al-coated fiber probe is analyzed by means of the radiation field theory. Since the electric field at the tangent direction of the interface for the Al-coated fiber probe is not continuous, a magnetic current source must be disposed at an exit port of the probe, so as to meet the boundary condition requirements of the probe. It is assumed that the Al layer coated on the fiber probe is a perfect conductor, so that the current source at the exit port of the fiber probe can be ignored. Therefore, the laser beam at the exit port of the fiber probe can be represented by the magnetic current source. Meanwhile, the magnetic vector potential and the equations of the electric field and magnetic field at the near-field observation point can be obtained from the magnetic current source. Therefore, the normalized power density at the near-field observation point of the fiber probe can be obtained by the following formula:

$$I_{nor}(x, y, z) = \frac{1}{2} \text{Re}\{\vec{E}_F \times \vec{H}_F^*\},$$

in which $I_{nor}(x,y,z)$ represents the normalized power density at the observation point, $\vec{E}_F$ represents the electric field at the observation point caused by the magnetic current source $\vec{M}_s$, $\vec{H}_F$ represents the magnetic field at the observation point caused by the magnetic current source $\vec{M}_s$, and the symbol * represents the complex conjugate.

Figure 3:
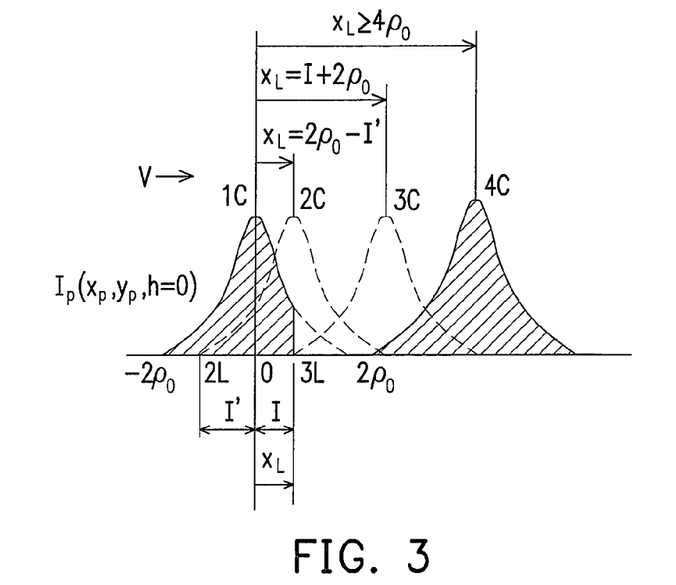
FIG. 3 is an integral area diagram of an exposure energy density formula of line lithography.

Since the workpiece is moving during the line lithography, and the exposure energy is accumulated, such that the exposure energy density integral formula when the workpiece is moving is proposed in the present invention, which is used to analyze the exposure energy density distribution on the photoresist surface. Referring to FIG. 3, it is assumed that a fiber probe (with a radius range of the exposure energy density as $2\rho_0$) with a radius of $\rho_0$ is used to perform line lithography, the lathe bed for carrying the workpiece thereon is moved towards the negative direction for a length L at a constant speed, that is to say, the probe relatively scans the workpiece for the length L towards rightwards at a constant speed V. Once the center point of the probe is moved rightwards at a constant speed V to reach a position (4C), where $X_L \geq 4\rho_0$ the left end of the optical power density waveform of the point fabrication will accordingly move to a position (4L), where $X_L \geq 2\rho_0$, as shown by two continuous waveforms of solid lines in FIG. 3. At this time, all the exposure power density of the point fabrication will pass through the section of $X_L \geq 2\rho_0$ successively, so that the exposure energy density should be integrated from $-2\rho_0$ to $2\rho_0$, and the exposure energy density formula thereof is shown as follows:

$$E_L((x_L, y_L, h = 0), V) = \frac{\int_{-2\rho_0}^{2\rho_0} I_p(x_p, y_p, h = 0) d_p}{V}, y_p = y_L,$$

$$2\rho_0 \leq x_L \leq L - 2\rho_0.$$

The exposure energy density distributions at various positions on the photoresist surface have been obtained by analyzing with the above formula. In the present invention, the interior of the photoresist is divided into limited nodes with coordinates of $((x,y),h)$ By combining with the exposure energy density integral formula, the concentration change of the photoactive compound (PAC) at each limited internal node after the photoresist has been exposed is calculated. In this part of the present invention, the photoresist exposure model proposed by Dill is adopted, and accordingly, the interior of the photoresist is divided into limited nodes with coordinates of $((x,y),h)$ and Dill photoresist exposure model is amended into the following formulas:

$$\frac{\partial I_{PR}((x_L, y_L), h, t)}{\partial h} = -I_{PR}((x_L, y_L), h, t) \times [A \times M_{PR}((x_L, y_L), h, t) + B],$$

$$\frac{\partial M_{PR}((x_L, y_L), h, t)}{\partial h} = -I_{PR}((x_L, y_L), h, t) \times M_{PR}((x_L, y_L), h, t) \times C,$$

in which $I_{PR}((x_L,y_L), h, t)$: the optical power density of the node in the photoresist at a depth h and at an exposure time t;

$M_{PR}((x_L,y_L),h,t)$: the relative concentration of the remained PAC of the node in the photoresist at the depth h and at the exposure time t; and t: the exposure time.

When the calculation of the photoresist development rate is analyzed, the development model proposed by Mack is adopted in the present invention. As previously described, $M_{PR}((x_L,y_L)h,t)$ of each node in the photoresist is calculated, and then, by combining with the Mack development model, the development rate of each node in the photoresist is calculated. Then, a development depth H at individual coordinates $(x_L,y_L)$ is calculated according to the development rate of each node. In the present invention, according to the photoresist development rate of $R_{bulk}$ proposed by the Mack development model, the interior of the photoresist is divided into each node with coordinates of $((x_L,y_L),h)$, and the Mack development model is amended into the following formula:

$$R_{bulk}((x_L, y_L), h, t) = R_{max} \times \frac{(\alpha+1) \times (1 - M_{PR}((x_L, y_L), h, t))^n}{\alpha + (1 - M_{PR}((x_L, y_L), h, t))^n} + R_{min},$$

in which:

$$\alpha = \frac{n+1}{n-1}(1 - M_{th})^n$$

$R_{bulk}((x_L,y_L),h,t)$: the photoresist development rate;

$R_{max}$: the photoresist development rate after the photoresist is exposed and irradiated for an extremely long time;

$R_{min}$: the photoresist development rate when the photoresist is not exposed;

$M_{th}$: a threshold value of the relative concentration of the PAC;

n: the selection factor.

The resin on the photoresist surface will be crosslinked due to the high-temperature baking process, and the dissolution resistant phenomenon occurs at the photoresist surface, so the development rate of the photoresist, when $0 \leq h \leq 10$, should be:

$$R_{10}((x_L,y_L),h,t) = R_{bulk}((x_L,y_L),h,t) \times (1-(1-R_0) \times e^{-\gamma h}).$$

Therefore, if the development time does not reach the critical time at which the photoresist surface is developed to the depth where the dissolution resistance effect is finished, the developed depth H of the photoresist can be obtained by the following formula:

$$\int_0^H \frac{dh}{R_{10}((x_L, y_L), h)} = \int_0^{t_d} d\tau.$$

If the development time exceeds the critical time, the developed depth of the photoresist is:

$$\int_{h_{crit}}^H \frac{dh}{R_{bulk}((x_L, y_L), h)} = \int_{t_{dcrit}}^{t_d} d\tau.$$

The developed depth of the photoresist at each node $(x_L,y_L)$ is calculated according to the development time, and the development depth H of all the coordinates $(x_L,y_L)$ of the whole photoresist is further drawn. Finally, the development depth H of all the photoresist coordinates $(x_L,y_L)$ can be connected to form a profile of the developed photoresist, and accordingly, the FWHM can be calculated according to the development profile.

In Step 202 of FIG. 2, a set of initial unknown parameters $P^{(0)}$ is input. In Step 202 of FIG. 2, the fabrication profile $(H_N)_i$ of the numerical operation can be obtained through the theoretical model of line lithography, and the fabrication profile $(H_M)_i$ of line lithography can be obtained through measurement. In Step 206 of FIG. 2, an error between the experimental result of line lithography and the simulation result of the theoretical model of the line fabrication of near field photolithography as an objective function, and the formula thereof is shown as follows:

$$E^*(p) = \frac{1}{2} \sum_{i=1}^m ((H_M)_i - (H_N)_i)^2 + \Psi(p).$$

In Step 208 of FIG. 2, J, g, H and the parameter increment $\delta^{(0)}$ are respectively calculated, in which J represents Jacobian Matrix, and the calculation formulas thereof are shown as follows:

$$J \begin{bmatrix} \frac{\partial r_1(p)}{\partial p} \\ \vdots \\ \frac{\partial r_m(p)}{\partial (p)} \end{bmatrix}_{m \times 1},$$

$$g = -\frac{d\Psi}{dp},$$

$$H = \frac{d^2\Psi}{dp^2},$$

$\delta = (-J^T r + g)/(J^T J + H + A)$, in which A is Marquardt parameter, $$r = \begin{bmatrix} r_1(p) \\ \vdots \\ r_m(p) \end{bmatrix}_{m \times 1}.$$

By adding the initial parameter value to the parameter increment, the real value of the amended parameter for the next iteration can be obtained, as shown in the following formula:

$$p^{(k+1)} = p^{(k)} + \delta^{(k)}.$$

In Step 208 of FIG. 2, the obtained new parameter is substituted into the theoretical model of the line fabrication of near field photolithography, so as to obtain a point data $H_N^{(k)}$ of the fabrication profile of a newly-processed section. In Step 210 of FIG. 2, the reasonable convergence criteria is searched through the Levenberg-Marquardt method, so as to inverse-calculate a fiber probe aperture size that can match with the line lithography experiment and the theoretical model of the line fabrication of near field photolithography. Finally, by comparing the fabrication profile of the line lithography experiment and that of the simulation result of the inverse-calculated fiber probe aperture size, it is verified that the inverse-calculated fiber probe aperture size is reasonable and acceptable.

Therefore, the non-destructive method of the present invention for inverse-calculating the fiber probe aperture size is achieved by combining with the theoretical model of the line fabrication of near field photolithography with experiments, and the flow chart thereof is shown in FIG. 2, which is described below in detail.

Step 1: a set of initial unknown parameters $P^{(0)}$ is input, and the point data $H_N^{(0)}$ of the fabrication profile of the section for the line lithography in the numerical operation is obtained through the theoretical model of the line fabrication of near field photolithography derived in the present invention.

Step 2: the penalty function weights of the initial function are set as $\phi^{(0)}=0.0001 \times c^{(0)} \times E^{(0)}$; and the inverse barrier function value $\psi^{(0)}$ and the objective function value $E^{*(0)}(p)$ are calculated.

Step 3: J, g, and H are respectively calculated.

Step 4: the parameter increment $\delta^{(0)}$ is calculated.

Step 5: a newly-estimated parameter value is obtained through $p^{(k+1)}=p^{(k)}+\delta^{(k)}$.

Step 6: the newly-obtained parameter is substituted into the theoretical model of the line fabrication of near field photolithography, so as to obtain a point data $H_N^{(k)}$ of the fabrication profile of a newly-processed section.

Step 7: a new objective function $E^{*(k)}(p)$ is calculated, and if the new objective function is less than the original objective function, go to Step 8; otherwise, the Levenberg-Marquardt parameter is amplified, that is, the increment of the parameter is reduced, i.e., $\Lambda=10\times\Lambda$, return to Step (4).

Step 8: if the convergence criteria $\{|\delta^{(k)}|/(10^{-4}+|p^{(k)}|)\}<10^{-4}$ is satisfied, the algorithm is ended; otherwise, $\Lambda$ and $\phi$ are reduced, that is, the increment of the parameter is amplified, i.e., $\Lambda=0.1\times\Lambda$, $\phi=0.1\times\phi$, return to Step 3.

In the present invention, a feasible fiber probe aperture size is inverse-calculated in the line fabrication experiment of near field photolithography through the Levenberg-Marquardt method. The point data of the fabrication profile of the section for the line lithography is obtained through the experiment of the line fabrication of near field photolithography and serves as the important basis for the inverse-calculation in the present invention. That is to say, the unknown fiber probe aperture size is inverse-calculated based on the actual physical phenomenon. In this way, the entire simulation architecture can be more complete.

In the experiment of the present invention for inversely calculating the fiber probe aperture size (the data is not provided), the used laser beam is an Ar ion laser beam with a wavelength of 488 nm, the photoresist is SPR3001 Model photoresist from SHIPLEY Company, and the developing solution is CD-26 developing solution. The following parameters are adopted: the exposure power P=57 nw, the fiber probe scanning speed V=1.5 μm/s, and the development time $t_d$=2 sec. It is known from the striograph scanned by the atomic force microscope (AFM) that, the lithography fabrication depth is 17.0 nm, and the FWHM is 167.0 nm.

From the fiber probe aperture size shot by a field emission scanning electron microscope (FESEM) with a multiplying factor of 60000 after the experiment, it can be estimated that the fiber probe aperture size in the horizontal direction is about $d_{max}$=262.0 nm, and the fiber probe aperture size in the perpendicular direction is about $d_{min}$=244.8 nm, so that the average fiber probe aperture size is about $d_{avg}$=253.4 nm. According to the procedures for inversely calculating the fiber probe aperture size of the present invention, the striograph scanned by AFM is appropriately gridded, so as to retrieve the point data of the lithography fabrication profile. The data of totally 21 points are retrieved, and the data of 21 points for the fabrication profile serves as the measurement point data $(H_M)_i$ in the inverse-calculation method, so as to perform the inverse-calculation. After being iterated for 100 times, the inverse-calculation step satisfies the convergence criteria, so that the calculation can be ended. At this time, the parameter value is $p^{(100)}$=250.6 nm, i.e., the inverse-calculated fiber probe aperture size d=250.6 nm.

Figure 4:
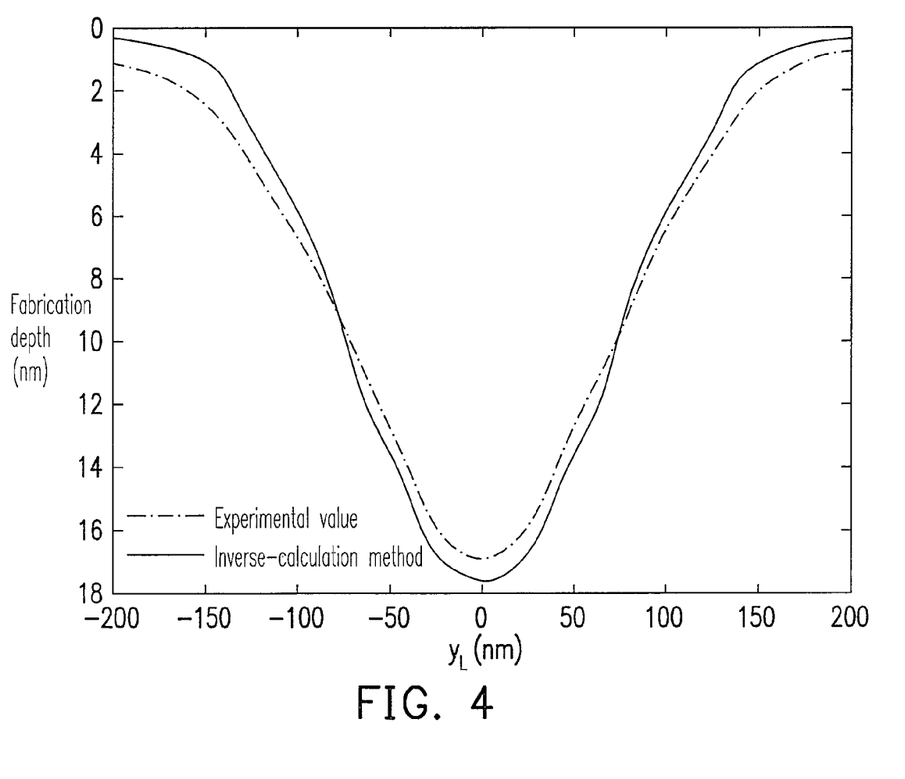
FIG. 4 is a comparison diagram of a simulated fabrication profile and an experimental fabrication profile, in which the simulated fabrication profile is simulated by substituting d=250.6 nm, the final result for inversely calculating the aperture size of the fiber probe, into the theoretical model of the line fabrication of near field photolithography according to an embodiment of the present invention.

FIG. 4 is a comparison diagram of the simulated fabrication profile and the experimental fabrication profile, in which the simulated fabrication profile is simulated by substituting d=250.6 nm, the final result for inversely calculating the aperture size of the fiber probe, into the theoretical model of the line fabrication of near field photolithography according to an embodiment of the present invention. In the simulated fabrication profile, FWHM=161.2 nm, and the fabrication depth H=17.6 nm, so that the error between the inverse-calculated FWHM of 161.2 nm and the experimental FWHM of 167.0 nm is about −2.9%. Meanwhile, as shown in FIG. 4, the largest error between the simulated fabrication profile and the experimental fabrication profile is at a position $y_L$=150 nm, and the value thereof is about 1.1 nm. Therefore, it is verified that the theoretical model of non-destructively inverse-calculating the fiber probe aperture size in the present invention is reasonable and acceptable when FWHM is greater than 100 nm.

Figure 5:
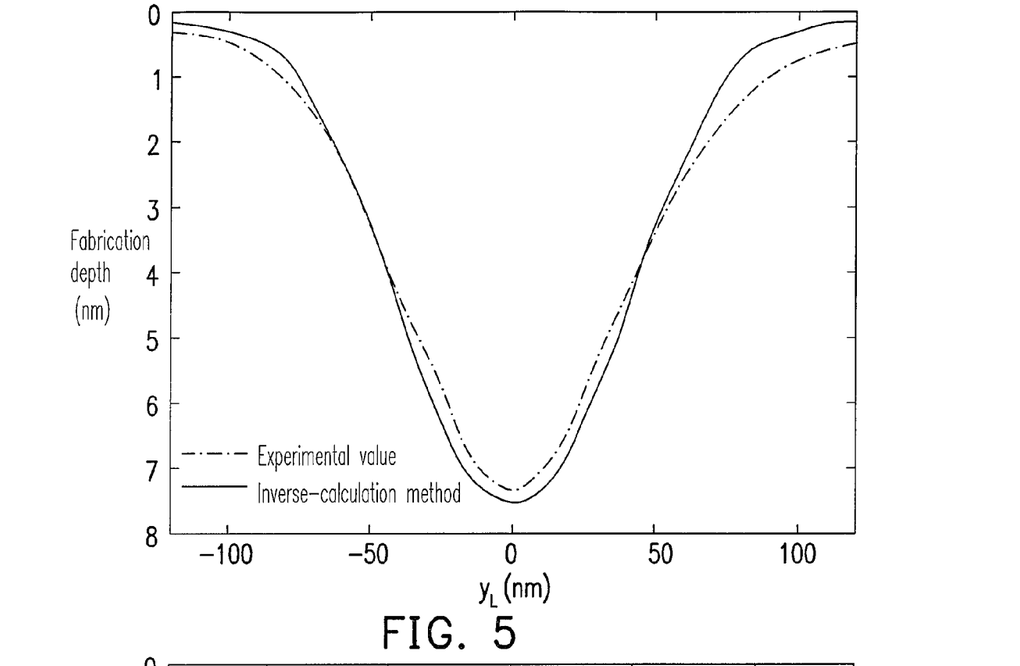
FIG. 5 is a comparison diagram of the simulated fabrication profile and the experimental fabrication profile, in which the simulated fabrication profile is simulated by substituting d=140.9 nm, the final result for inversely calculating the aperture size of the fiber probe, into the theoretical model of the line fabrication of near field photolithography according to an embodiment of the present invention.

In the present invention, another set of experiments for inversely calculating the fiber probe aperture size is performed (the data is not provided), and the parameters adopted in this embodiment are listed as follows: the exposure power P=33 nw, the fiber probe scanning speed V=23 μm/s, and the development time $t_d$=2 sec. As known from the striograph scanned by the AFM that, the lithography fabrication depth is 7.4 nm, and FWHM is 89.1 nm. During the process for inversely calculating the fiber probe aperture size according to the present invention, the striograph scanned by the AFM is appropriately gridded, so as to retrieve the point data of the lithography fabrication profile. The data of totally 25 points are retrieved, which serve as the measurement point data $(H_M)_i$ in the inverse-calculation method, so as to perform the inverse-calculation. After being iterated for 71 times, the inverse-calculation step satisfies the convergence criteria, so that the calculation can be ended. At this time, the parameter value is $p^{(71)}$=140.9 nm, i.e., the inverse-calculated fiber probe aperture size d=140.9 nm FIG. 5 is a comparison diagram of the simulated fabrication profile and the experimental fabrication profile, in which the simulated fabrication profile is simulated by substituting d=140.9 nm, the final result for inversely calculating the aperture size of the fiber probe, into the theoretical model of the line fabrication of near field photolithography according to an embodiment of the present invention. In the simulated fabrication profile, FWHM=92.4 nm, the fabrication depth H=7.5 nm; and the experimental FWHM is 89.1 nm, so that the error between the inverse-calculated FWHM and the experimental FWHM is about 3.7%. Therefore, it is verified that the theoretical model of non-destructively inverse-calculating the fiber probe aperture size of the present invention is applicable when FWHM is less than 100 nm.

Figure 6:
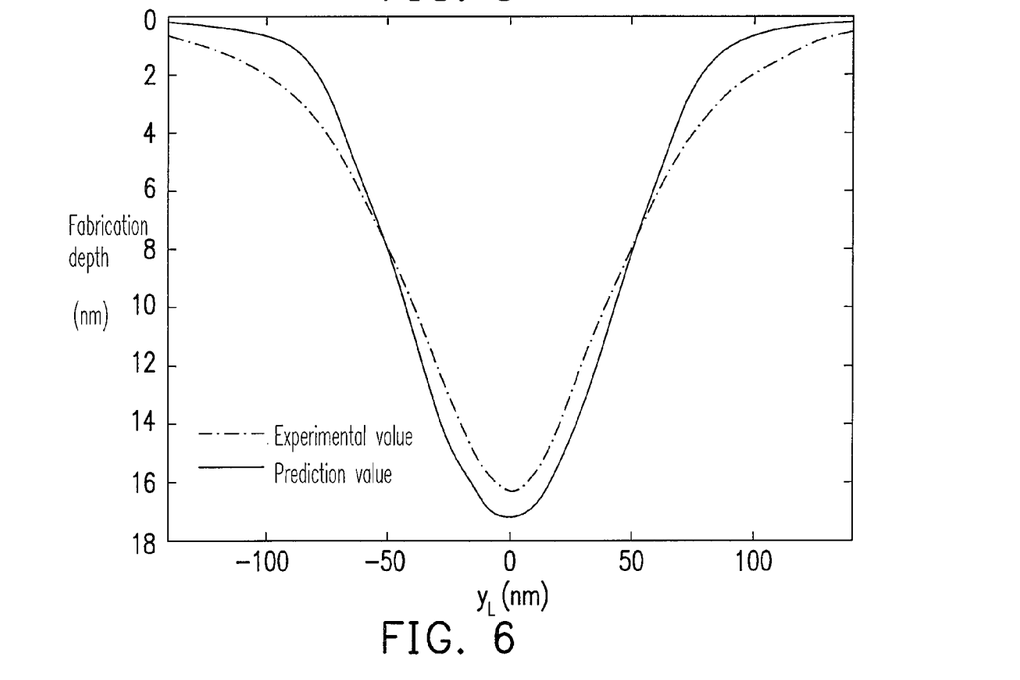
FIG. 6 is a comparison diagram of the simulated predicted fabrication profile and the experimental fabrication profile according to an embodiment of the present invention.

The method of the present invention further includes a simulation and prediction method of the fabrication profile of near field photolithography by analyzing the fiber probe with the aperture size being inversely calculated and combining with other parameter control of near field photolithography. FIG. 6 is a schematic view of the simulation and prediction method of the fabrication profile of near field photolithography according to a preferred embodiment of the present invention. As the above described, after the fiber probe with the inverse-calculating aperture size of d=140.9 nm has been simulated by combining with the theoretical model of the line fabrication of near field photolithography, it is known that if the scanning speed for the fiber probe is adjusted to V=1.5

μm/s, a processing line with FWHM=97.2 nm, and the fabrication depth of H=17.2 nm can be fabricated. According to the present invention, a verification experiment for the simulated and predicted fabrication profile is further performed (the data is not provided), the parameters adopted are listed as follows: the fiber probe aperture size d=140.9 nm, the exposure power P=33 nw, the scanning speed for the fiber probe V=1.5 μm/s, and the development time $t_d$2 sec. After the experiment, it is known from the striograph scanned by the AFM that, the lithography fabrication depth is 16.4 mm, and FWHM is 101.6 nm. As for the simulated and predicted fabrication profile, FWHM=97.2 nm, the fabrication depth is H=17.2 nm; and the experimental FWHM is 101.6 nm. The error between the FWHM of the simulated and predicted fabrication profile and that of the experimental fabrication profile is about −3.3%, and the experimental result and the simulated and predicted value are considerably close. Finally, a simulation experiment for the predicted fabrication profile is further performed in the present invention. After the fiber probe with the inverse-calculated aperture size of d=140.9 nm has been simulated by combining with the theoretical model of the line fabrication of near field photolithography, it is known that if the scanning speed for the fiber probe is adjusted to V=3 μm/s, a processing line with FWHM=87.2 nm and the fabrication depth of H=4.3 nm can be fabricated. Therefore, as the above analyzed, it is known that after the fiber probe with the inverse-calculated aperture size is simulated and predicted by combining with the theoretical model of the line fabrication of near field photolithography, together with the control of experimental parameters, the fabrication profile of near field photolithography can be predicted, which processes the industrial application value.

The non-destructive method for inverse-calculating the fiber probe aperture size of the present invention is illustrated with reference to FIGS. 4 and 5 and the theoretical model for non-destructively inversely calculating the fiber probe aperture size herein is applicable for the following circumstance that the FWHM for the line fabrication of near field photography is greater than 100 nm or less than or equal to 100 nm. During the production of the fiber probe, the fiber probes can be classified into different groups and sets according to the aperture size thereof, and marked with the probe aperture size, so as to be category managed and sold, which thus enhancing the industrial value of the fiber probe.

As known from the preferred embodiment of the present invention that, the present invention has the following advantages: the non-destructive theoretical model for inverse-calculating the fiber probe aperture size built in the present invention can be used to solve the current bottleneck that the aperture size can be obtained merely through destructively measuring the fiber probe, which is a breakthrough in the measurement technique for the fiber probe aperture size and has great industrial application value. The manufacturers of the probe can inverse-calculate the aperture size through the non-destructive method, and during the production of the fiber probes, the fiber probes can be classified into different groups and sets, and marked with the probe aperture size, so as to be category managed and sold, which enhances the industrial value of the fiber probes. Meanwhile, since the fiber probe with an inverse-calculated aperture size is merely used in the line lithography experiment, without using the SEM destructive measurement, the fiber probe still can be used. The user can predict the fabrication profile of near field photolithography by combining with other parameter control of near field photolithography.

The flow of the theoretical model of the point fabrication of near field photolithography in the present invention is illustrated as follows: first, a near-field optical power density distribution of an Al-coated fiber probe is analyzed through the radiation field theory; and then, the exposure power density of the photoresist $I_{density}(x,y,z=5)$ can be calculated through the experimental optical power value and normalized power density. Therefore, during the point fabrication of near field photolithography, the power density absorbed by the photoresist surface is:

$$E_{density}((x,y,z=5),t)=I_{density}(x,y,z=5)\times t,$$

in which $E_{density}((x,y,z=5),t)$ represents the energy density absorbed by the photoresist surface at the exposure time t, $I_{density}(x,y,z=5)$ represents the exposure power density radiated on the photoresist surface by the fiber probe, and t is the exposure time.

In the present invention, the theoretical model of the point fabrication of near field photolithography is built through the above method for analyzing the exposure energy density of the photoresist by combining with the Dill exposure model and the Mack development model. Furthermore, the flow of the non-destructive method for inversely calculating the fiber probe aperture size, which is built through the theoretical model of the point fabrication of near field photolithography combining with the point fabrication experiment, is the same as that of the theoretical model of the line fabrication of near field photolithography, which thus will not be described herein any more. Meanwhile, the fiber probe with an inverse-calculated aperture size, by combining with other parameter control of the point fabrication of near field photolithography, can be used to simulate and predict the fabrication profile of near field photolithography.

The line fabrications of near field photolithography with the FWHM of greater than 100 nm or less than or equal to 100 nm all fall within the scope of the present invention. Meanwhile, the experiment steps and flows similar to that of the preferred embodiment of the present invention are contemplated to fall within the scope of the claims of the present invention.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A non-destructive method for inverse-calculating a fiber probe aperture size and a prediction method of a fabrication profile of near field photolithography, comprising:

a first step of building a theoretical model of near field photolithography, including a theoretical model of a point fabrication of near field photolithography and a theoretical model of a line fabrication of near field photolithography;

a second step of setting an error between a simulation result of the theoretical model of the line fabrication of near field photolithography and an experimental result of a line lithography fabrication as an objective function;

a third step of searching for a reasonable convergence criteria through Levenberg-Marquardt method and inverse-calculating a fiber probe aperture size that matches with the line lithography experiment and the theoretical model of the line fabrication of near field photolithography;

a forth step of comparing a fabrication profile of the line lithography experiment and that of the simulation result of the inverse-calculated probe aperture size, so as to verify that the inverse-calculated fiber probe aperture size is reasonable; and a fifth step of predicting the fabrication profile of near field photolithography by combining with the parameter control of near field photolithography, by means of inverse-calculating the fiber probe aperture size;

wherein the step of building the theoretical model of the line fabrication of near field photolithography comprises the following detailed steps (1)-(6):

(1) a near-field optical power density of the fiber probe is analyzed by a radiation field theory, and a normalized near-field power density at a near-field observation point of the fiber probe is calculated as follows:

$$I_{nor}(x, y, z) = \frac{1}{2} \text{Re}\{\vec{E}_F \times \vec{H}_F^*\},$$

wherein $I_{nor}(x,y,z)$ represents the normalized power density at the observation point, $\vec{E}_F$ represents an electric field at the observation point caused by a magnetic current source $\vec{m}_S$, $\vec{H}_F$ represents a magnetic field at the observation point caused by a magnetic current source $\vec{M}_S$, and the symbol * represents a complex conjugate, $\text{Re}\{\vec{E}_F \times \vec{H}_F^*\}$ represents a real part of $\{\vec{E}_F \times \vec{H}_F^*\}$;

(2) an exposure energy density distribution of the line lithography is analyzed by an exposure energy density integral formula, and the exposure energy density formula is shown as follows:

$$E_L((x_L, y_L, h = 0), V) = \frac{\int_{-2\rho_0}^{2\rho_0} I_P(x_P, y_P, h = 0) dx_P}{V}$$

$$y_P = y_L,$$

$$2\rho_0 \leq x_L \leq L - 2\rho_0,$$

wherein $E_L((x_L,y_L,h=0),V)$ represents the exposure energy density on a photoresist surface during line processing, and V represents a relative speed for the probe to scan a workpiece towards rightwards, $I_P(x_p,y_p,h=0)$ represents the power density distribution on a photoresist surface (h=0) with the photoresist surface coordinates of $(x_p,y_p,h=0)$ during a point fabrication;

(3) the interior of the photoresist is divided into limited nodes with coordinates of ((x,y),h) and a concentration change of a photoactive compound (PAC) at each internal limited node after the photoresist is exposed is calculated by combining with the exposure energy density integral formula;

(4) the interior of the photoresist is divided into each node with coordinates of $((x_L,y_L),h)$, and the photoresist exposure model is:

$$\frac{\partial I_{PR}((x_L, y_L), h, t)}{\partial h} = -I_{PR}((x_L, y_L), h, t) \times [A \times M_{PR}((x_L, y_L), h, t) + B],$$

$$\frac{\partial M_{PR}((x_L, y_L), h, t)}{\partial t} = -I_{PR}((x_L, y_L), h, t) \times M_{PR}((x_L, y_L), h, t) \times C,$$

wherein:

$I_{PR}((x_L,y_L),h,t)$: an optical power density of the node in the photoresist layer at a depth h and at an exposure time t with the photoresist layer coordinates of $(x_L,y_L,h)$ during the line fabrication, $M_{PR}((x_L,y_L),h,t)$: a relative concentration of the remained PAC of the node in the photoresist layer at the depth h and at the exposure time t, t: an exposure time;

(5) the interior of the photoresist is divided into each node with coordinates of $((x_L,y_L),h)$, and a model for analyzing a photoresist development rate is:

$$R_{bulk}((x_L, y_L), h, t) = R_{max} \times \frac{(\alpha + 1) \times (1 - M_{PR}((x_L, y_L), h, t))^n}{\alpha + (1 - M_{PR}((x_L, y_L), h, t))^n} + R_{min},$$

wherein:

$$\alpha = \frac{n+1}{n-1}(1 - M_{th})^n$$

$R_{bulk}((x_L,y_L),h,t)$: the photoresist development rate, $R_{max}$: the photoresist development rate after the photoresist is exposed and irradiated for an extremely long time, $R_{min}$: the photoresist development rate when the photoresist is not exposed, $M_{th}$: a threshold value of the relative concentration of the PAC, n: a selection factor;

(6) $M_{PR}((x_L,y_L),h,t)$ of each node within the photoresist is calculated; and the development rate of each node within the photoresist is further calculated by combining with a Mack developing model; a development depth H at individual coordinates $(x_L,y_L)$ is calculated by the development rate of each node; and then the development depth H and the full width half maximum (FWHM) at all coordinates $(x_L,y_L)$ of the whole photoresist is drawn;

the step of setting an error between a simulation result of the theoretical model of the line fabrication of near field photolithography and an experimental result of a line lithography fabrication profile of the section for the line lithography in the numerical operation is obtained through the above derived theoretical model of the line fabrication of near field photolithography;

(2) penalty function weights are set, $\phi^{(0)}=0.0001 \times c^{(0)} \times E^{(0)}$, and the inverse barrier function value $\psi^{(0)}$ and the objective function value $E^{*(0)}(p)$ are calculated;

(3) J, g, and H are respectively calculated;

wherein J represents Jacobian Matrix, g and H contain the first and second derivatives, respectively, of the inverse barrier function with respect to the parameters and the calculation formulas thereof are shown as follows:

$$J = \begin{bmatrix} \frac{\partial r_1(p)}{\partial p} \\ \vdots \\ \frac{\partial r_m(p)}{\partial (p)} \end{bmatrix}_{m \times 1},$$

$$g = -\frac{d\Psi}{dp},$$

$$H = \frac{d^2\Psi}{d^2 p};$$

(4) a parameter increment $\delta^{(0)}$ is calculated, and the calculation formula thereof is shown as follows:

$$\delta = (-J^T r + g)/(J^T J + H + \Lambda),$$

wherein: $\Lambda$ represents the Marquardt parameter, the residual vector, r, is defined by:

$$r_i(p) = (H_M)_i - (H_N)_i$$

fabrication as an objective function comprises the following detailed steps (1)-(2):
(1) a striograph of the line fabrication experiment of near field photolithography is appropriately gridded, so as to retrieve point data of the lithography fabrication profile;
(2) an error between the simulation result of the theoretical model of the line fabrication of near field photolithography and the experimental result of the line lithography is set as an objective function, and the objective function formula is:

$$E^*(p) = \frac{1}{2}\sum_{i=1}^{m}((H_M)_i - (H_N)_i)^2 + \Psi(p),$$

wherein, $H_M$ represents the measurement data, and the measurement data is the fabrication profile measured on a section of the line lithography,
$H_N$ represents a numerical operation result, and the numerical operation result is the fabrication profile measured on a section of the line lithography resulted from the simulation of the theoretical model of the line lithography,
m represents the number of points measured on a section of the line lithography,
$\psi(p)$ is called an inverse barrier function;
the step of searching for a reasonable convergence criteria through Levenberg-Marquardt method and inverse-calculating a fiber probe aperture size that matches with the line lithography experiment and the theoretical model of the line fabrication of near field photolithography comprises the following detailed steps (1)-(8):
(1) a set of initial unknown parameters $p^{(0)}$ is input, and the point data $H_N^{(0)}$ of the
r is expressed in a matrix as follows:

$$r = \begin{bmatrix} r_1(p) \\ \vdots \\ r_m(p) \end{bmatrix}_{m \times 1};$$

(5) a newly-estimated parameter value is obtained by $p^{(k+1)} = p^{(k)} + \delta^{(k)}$;
(6) the newly-obtained parameter is substituted into the theoretical model of the line fabrication of near field photolithography, to obtain a new point data $H_N^{(k)}$ of the fabrication profile of a newly-processed section;
(7) a new objective function $E^{*(k)}(p)$ is calculated, and if the new objective function is smaller than the original objective function, go to Step (8); otherwise, the Levenberg-Marquardt parameter is amplified, so as to reduce the increment of the parameter, i.e., $\Lambda = 10 \times \Lambda$, return to Step (4);
(8) if the convergence criteria $\{|\delta^{(k)}|/(10^{-4} + |p^{(k)}|)\} < 10^{-4}$ is satisfied, the algorithm is ended; otherwise, $\Lambda$ and $\phi$ are reduced, so as to amplify the increment of the parameter, i.e., $\Lambda = 0.1 \times \Lambda$, $\phi = 0.1 \times \phi$, and return to Step (3);
in the step of building the theoretical model of near field photolithography, building the theoretical model of a point fabrication of near field photolithography comprises the following detailed steps (1)-(2):
(1) the near-field optical power density of the fiber probe is analyzed by the radiation field theory, and the normalized near field power density at the observation point of the fiber probe is calculated as:

$$I_{nor}(x, y, z) = \frac{1}{2}\text{Re}\{\overrightarrow{E}_F \times \overrightarrow{H}_F^*\},$$

wherein, $I_{nor}(x,y,z)$ represents the normalized power density at the observation point, $\overrightarrow{E}_F$ represents the electric field at the observation point caused by the magnetic current source $\overrightarrow{M}_S$, $\overrightarrow{H}_F$ represents the magnetic field at the observation point caused by the magnetic current source $\overrightarrow{M}_S$, and the symbol * represents the complex conjugate, $\text{Re}\{\overrightarrow{E}_F \times \overrightarrow{H}_F^*\}$ represents a real part of $\{\overrightarrow{E}_F \overrightarrow{H}_F^*\}$;
(2) the exposure energy density distribution of a point lithography fabrication is analyzed by the exposure energy density formula of a static fixed point, and when performing the point fabrication of near field photolithography, the energy density absorbed by the photoresist surface is:

$$E_{density}((x,y,z=5),t) = I_{density}(x,y,z=5) \times t,$$

wherein $E_{density}((x,y,z=5),t$ presents the energy density absorbed by the photoresist surface at the exposure time t, $I_{density}(x,y,z=5)$ represents the exposure power density radiated on the photoresist surface by the fiber probe, and t is the exposure time.

2. The prediction method as claimed in claim 1, wherein the FWHM of the point fabrication and the line fabrication of near field photolithography greater than 100 nm or less than or equal to 100 nm is within the range of application.

3. The prediction method as claimed in claim 1, wherein during the production of fiber probes, by inverse-calculating fiber probe aperture size, the fiber probes are classified into different groups and sets according to the aperture size, and marked with the probe aperture size, so as to be category managed and sold.

* * * * *